US011233376B2

(12) United States Patent
Okamoto et al.

(10) Patent No.: US 11,233,376 B2
(45) Date of Patent: Jan. 25, 2022

(54) SEMICONDUCTOR LASER AND ATOMIC OSCILLATOR

(71) Applicant: Seiko Epson Corporation, Tokyo (JP)

(72) Inventors: Junichi Okamoto, Shiojiri (JP); Koichi Kobayashi, Fujimi (JP); Takashi Miyata, Shiojiri (JP)

(73) Assignee: Seiko Epson Corporation

(*) Notice: Subject to any disclaimer, the term of this patent is extended or adjusted under 35 U.S.C. 154(b) by 112 days.

(21) Appl. No.: 16/832,100

(22) Filed: Mar. 27, 2020

(65) Prior Publication Data
US 2020/0313395 A1 Oct. 1, 2020

(30) Foreign Application Priority Data

Mar. 28, 2019 (JP) .............................. JP2019-064398

(51) Int. Cl.
*H01S 5/20* (2006.01)
*H01S 5/24* (2006.01)
(Continued)

(52) U.S. Cl.
CPC ........ *H01S 5/18311* (2013.01); *H01S 5/0071* (2013.01); *H01S 5/2018* (2013.01); *H01S 5/24* (2013.01); *H01S 5/005* (2013.01)

(58) Field of Classification Search
CPC .... H01S 5/18311; H01S 5/0071; H01S 5/005; H01S 5/04254; H01S 5/04256
(Continued)

(56) References Cited

U.S. PATENT DOCUMENTS 6,134,251 A * 10/2000 Kawase ............... B82Y 20/00
372/106
2003/0015726 A1   1/2003 Iwai et al.
(Continued)

FOREIGN PATENT DOCUMENTS

JP    H11-054838 A    2/1999
JP    2003-086896 A   3/2003
(Continued)

OTHER PUBLICATIONS

C. Helms et al., "Reliability of Oxide VCSELs at Emcore", Proceedings of SPIE, vol. 5364, pp. 183-189 (Jun. 2004).

*Primary Examiner* — Tuan N Nguyen
(74) *Attorney, Agent, or Firm* — Harness, Dickey & Pierce, P.L.C.

(57) ABSTRACT

There is provided a semiconductor laser including: a first mirror layer; a second mirror layer; an active layer; a current confinement layer; a first region including a plurality of first oxidized layers; and a second region including a plurality of second oxidized layers, in which, in a plan view, the laminated body includes a first part including the first region and the second region, a second part including the first region and the second region, and a third part disposed between the first part and the second part and resonating light generated in the active layer, the third part includes a fourth part including the first region and the second region and having a first groove, a fifth part including the first region and the second region and having a second groove, and a sixth part disposed between the fourth part and the fifth part and sandwiched between the first part and the second part, in a plan view.

8 Claims, 16 Drawing Sheets

(51) Int. Cl.
*H01S 5/00* (2006.01)
*H01S 5/183* (2006.01)

(58) Field of Classification Search
USPC .................................................. 372/43.01
See application file for complete search history.

(56) References Cited

U.S. PATENT DOCUMENTS

| | | |
|---|---|---|
| 2006/0013276 A1 | 1/2006 | McHugo |
| 2007/0091965 A1 | 4/2007 | Tanabe et al. |
| 2008/0240194 A1 | 10/2008 | Maeda et al. |
| 2015/0180204 A1 | 6/2015 | Takenaka et al. |
| 2015/0180205 A1 | 6/2015 | Kaneko et al. |
| 2015/0180207 A1 | 6/2015 | Kaneko et al. |
| 2015/0180214 A1 | 6/2015 | Nishida |

FOREIGN PATENT DOCUMENTS

| | | |
|---|---|---|
| JP | 2006-032964 A | 2/2006 |
| JP | 2007-142375 A | 6/2007 |
| JP | 2008-244060 A | 10/2008 |
| JP | 2015-119136 A | 6/2015 |
| JP | 2015-119138 A | 6/2015 |
| JP | 2015-119145 A | 6/2015 |
| JP | 2015-119147 A | 6/2015 |
| WO | WO-99/007043 A1 | 2/1999 |

\* cited by examiner

SEMICONDUCTOR LASER AND ATOMIC OSCILLATOR

The present application is based on, and claims priority from JP Application Serial Number 2019-064398, filed Mar. 28, 2019, the disclosure of which is hereby incorporated by reference herein in its entirety.

BACKGROUND

1. Technical Field

The present disclosure relates to a semiconductor laser and an atomic oscillator.

2. Related Art

A surface emitting semiconductor laser is used as a light source of an atomic oscillator using, for example, coherent population trapping (CPT) which is one of the quantum interference effects. Such a semiconductor laser has two mirror layers and an active layer disposed between the two mirror layers. Furthermore, the semiconductor laser has a current confinement layer for preventing a current injected into the active layer from spreading within the surface of the active layer.

As such a semiconductor laser, for example, JP-A-2015-119138 discloses a semiconductor laser including a lamination structure of a first mirror layer constituted with 40.5 pairs of n-type $Al_{0.12}Ga_{0.88}As$ layer and n-type $Al_{0.9}Ga_{0.1}As$ layer, an active layer, and a second mirror constituted with 20 pairs of p-type $Al_{0.12}Ga_{0.88}As$ layer and p-type $Al_{0.9}Ga_{0.1}As$ layer on the n-type GaAs substrate.

In JP-A-2015-119138, the current confinement layer is formed by changing one layer of the second mirror to a layer having a large Al composition ratio and oxidizing the layer from the side surface. When the current confinement layer is formed, the $Al_{0.9}Ga_{0.1}As$ layer that constitutes the first mirror and the second mirror is also oxidized to form an oxidized region.

The oxidized region is formed by replacing the arsenic in the $Al_{0.9}Ga_{0.1}As$ layer with oxygen, but the volume shrinks at this time. Therefore, stress is generated in a resonance portion by the oxidized region. When defects occur in the resonance portion due to this stress, the characteristics of the semiconductor laser change.

SUMMARY

The present disclosure can be implemented as the following application examples.

A semiconductor laser according to an application example of the present disclosure includes: a first mirror layer; a second mirror layer; an active layer disposed between the first mirror layer and the second mirror layer; a current confinement layer disposed between the first mirror layer and the second mirror layer; a first region provided continuously with the first mirror layer and including a plurality of first oxidized layers; and a second region provided continuously with the second mirror layer and including a plurality of second oxidized layers, in which the first mirror layer, the second mirror layer, the active layer, the current confinement layer, the first region, and the second region constitute a laminated body, in a plan view, the laminated body includes a first part including the first region and the second region, a second part including the first region and the second region, and a third part disposed between the first part and the second part and resonating light generated in the active layer, the third part includes a fourth part including the first region and the second region, a fifth part including the first region and the second region, and a sixth part disposed between the fourth part and the fifth part and sandwiched between the first part and the second part, in a plan view, a first groove is provided at the fourth part, and a second groove is provided at the fifth part.

An atomic oscillator according to an application example of the present disclosure includes: a semiconductor laser; an atom cell irradiated with light emitted from the semiconductor laser and containing alkali metal atoms; and a light receiving element that detects intensity of light transmitted through the atom cell and outputs a detection signal, in which the semiconductor laser includes a first mirror layer, a second mirror layer, an active layer disposed between the first mirror layer and the second mirror layer, a current confinement layer disposed between the first mirror layer and the second mirror layer, a first region provided continuously with the first mirror layer and including a plurality of first oxidized layers, and a second region provided continuously with the second mirror layer and including a plurality of second oxidized layers, the first mirror layer, the second mirror layer, the active layer, the current confinement layer, the first region, and the second region constitute a laminated body, in a plan view, the laminated body includes a first part including the first region and the second region, a second part including the first region and the second region, and a third part disposed between the first part and the second part and resonating light generated in the active layer, the third part includes a fourth part including the first region and the second region, a fifth part including the first region and the second region, and a sixth part disposed between the fourth part and the fifth part and sandwiched between the first part and the second part, in a plan view, a first groove is provided at the fourth part, and a second groove is provided at the fifth part.

DESCRIPTION OF EXEMPLARY EMBODIMENTS

Hereinafter, appropriate embodiments of the present disclosure will be described in detail with reference to the drawings. The embodiments described below are not inappropriately limited to the contents of the present disclosure described in the appended claims. In addition, not all of the configurations described below are essential configuration requirements of the present disclosure.

1. First Embodiment 1.1. Semiconductor Laser

Figure 1:
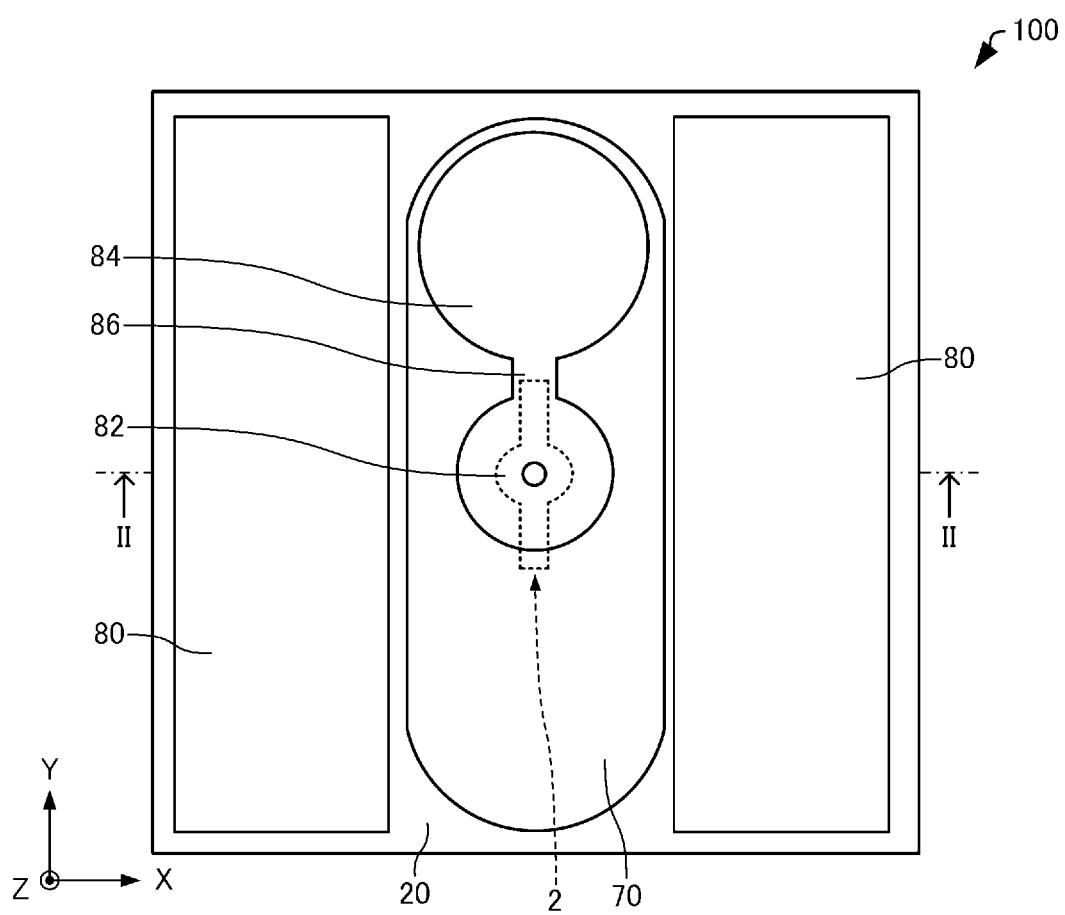
FIG. 1 is a plan view schematically illustrating a semiconductor laser according to a first embodiment.
Figure 2:
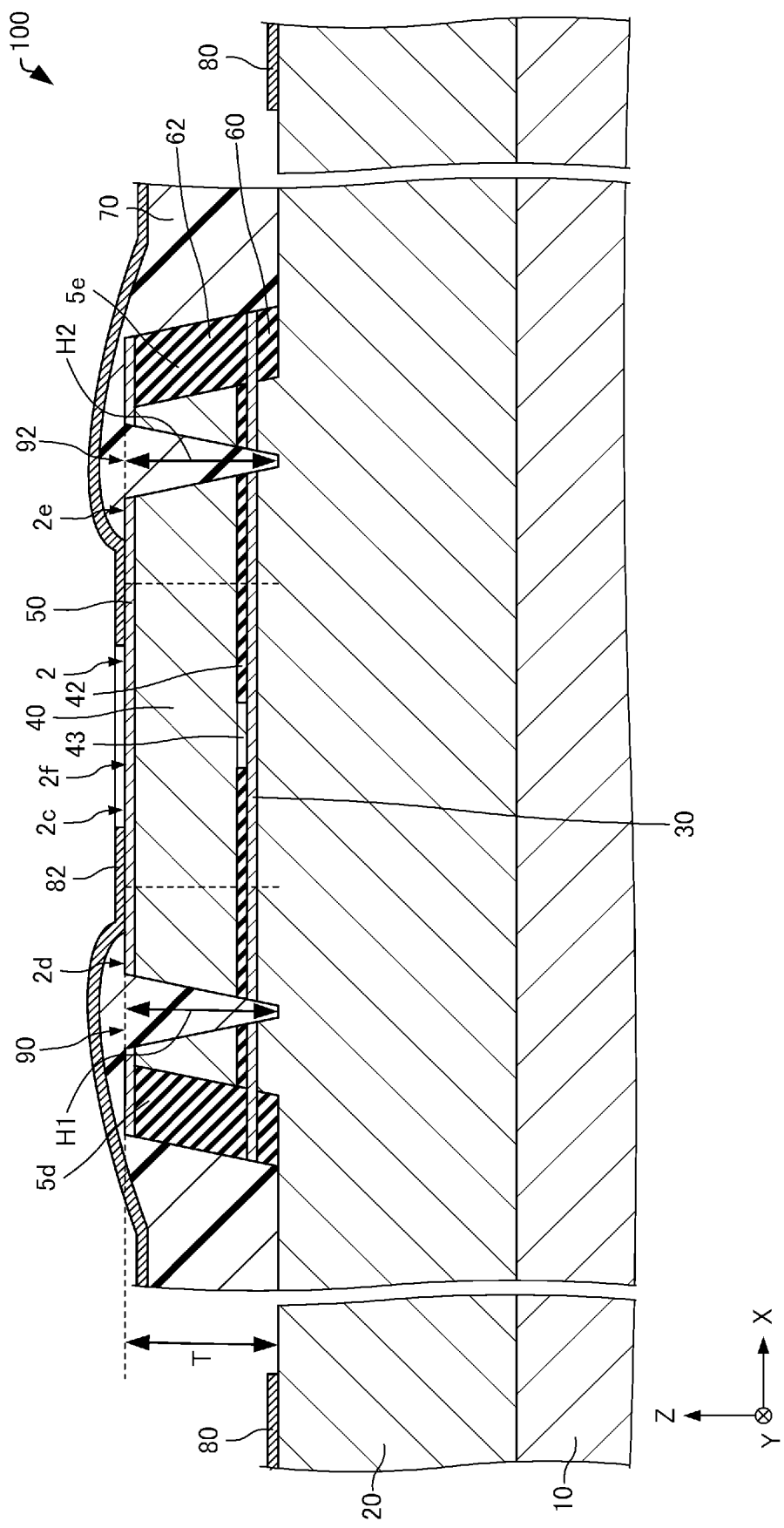
FIG. 2 is the sectional view schematically illustrating a semiconductor laser according to the first embodiment.
Figure 3:
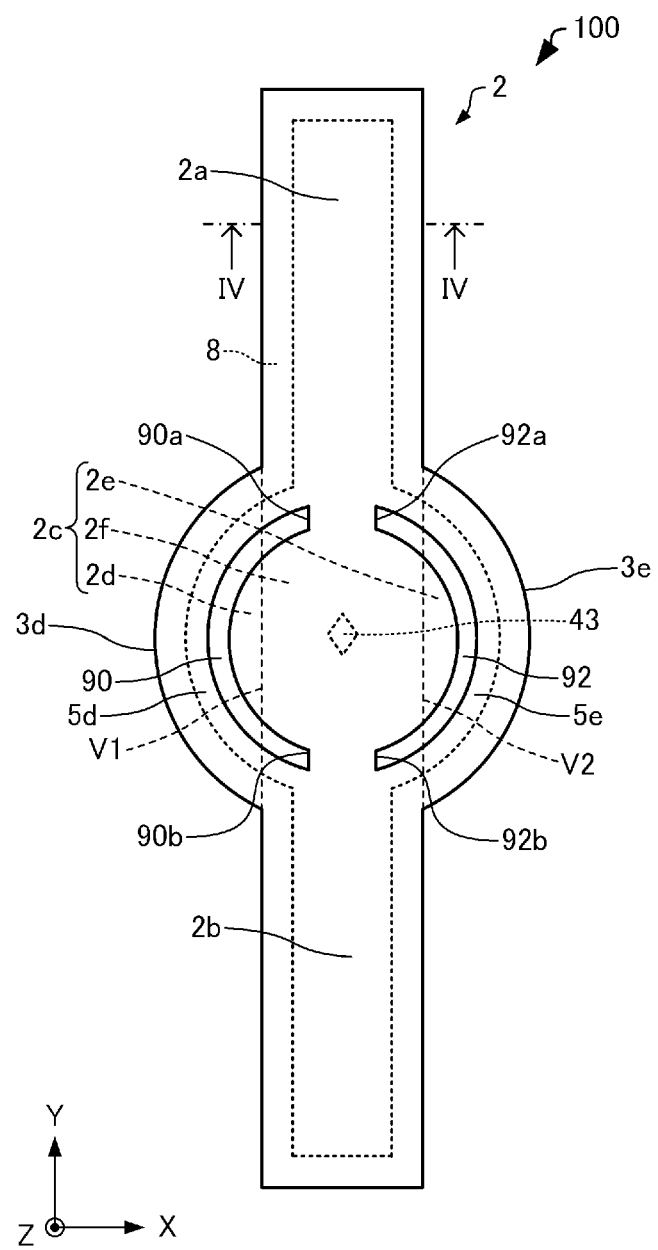
FIG. 3 is a plan view schematically illustrating the semiconductor laser according to the first embodiment.
Figure 4:
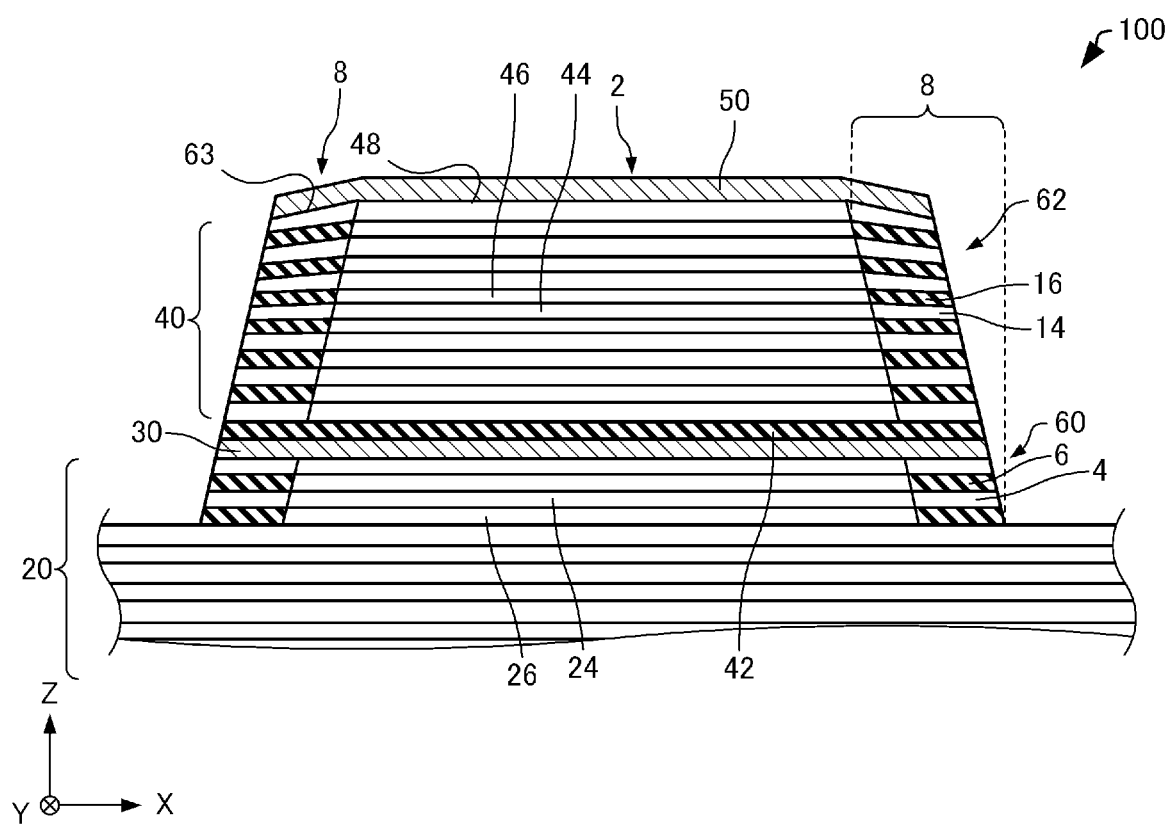
FIG. 4 is a sectional view schematically illustrating the semiconductor laser according to the first embodiment.

First, a semiconductor laser according to a first embodiment will be described with reference to the drawings. FIG. 1 is a plan view schematically illustrating a semiconductor laser 100 according to the first embodiment. FIG. 2 is a sectional view taken along the line II-II of FIG. 1, schematically illustrating the semiconductor laser 100 according to the first embodiment. FIG. 3 is a plan view schematically illustrating the semiconductor laser 100 according to the first embodiment. FIG. 4 is a sectional view taken along the line IV-IV of FIG. 3, schematically illustrating the semiconductor laser 100 according to the first embodiment.

For convenience, in FIG. 2, a laminated body 2 is illustrated in a simplified manner. In FIG. 3, members other than the laminated body 2 of the semiconductor laser 100 are not illustrated. FIGS. 1 to 4 illustrate an X axis, a Y axis, and a Z axis as three axes orthogonal to each other. Further, in this specification, a positional relationship in the semiconductor laser 100 will be described with a second electrode 82 side upward and a substrate 10 side downward, relatively.

The semiconductor laser 100 is, for example, a vertical cavity surface emitting laser (VCSEL). As illustrated in FIGS. 1 to 4, the semiconductor laser 100 includes the substrate 10, a first mirror layer 20, an active layer 30, a second mirror layer 40, a current confinement layer 42, a contact layer 50, a first region 60, a second region 62, a resin layer 70, a first electrode 80, and a second electrode 82.

The substrate 10 is, for example, a first conductivity type GaAs substrate. The first conductivity type is, for example, an n type.

The first mirror layer 20 is disposed over the substrate 10. The first mirror layer 20 is disposed on the substrate 10 side with respect to the active layer 30. The first mirror layer 20 is disposed between the substrate 10 and the active layer 30. The first mirror layer 20 is, for example, an n-type semiconductor layer. The first mirror layer 20 is a distributed bragg reflector (DBR) mirror. As illustrated in FIG. 4, the first mirror layer 20 is constituted by alternately laminating high refractive index layers 24 and low refractive index layers 26. The high refractive index layer 24 is, for example, an n-type $Al_{0.12}Ga_{0.88}As$ layer doped with silicon. The low refractive index layer 26 is, for example, an n-type $Al_{0.9}Ga_{0.1}As$ layer doped with silicon. The lamination number of the high refractive index layers 24 and the low refractive index layers 26 is, for example, 10 pairs or more and 50 pairs or less.

The active layer 30 is disposed over the first mirror layer 20. The active layer 30 is disposed between the first mirror layer 20 and the second mirror layer 40. The active layer 30 has, for example, a multi quantum well (MQW) structure in which three layers of quantum well structures constituted with an i-type $In_{0.06}Ga_{0.94}As$ layer and an i-type $Al_{0.3}Ga_{0.7}As$ layer are laminated.

The second mirror layer 40 is disposed over the active layer 30. The second mirror layer 40 is disposed on the side opposite to the substrate 10 side with respect to the active layer 30. The second mirror layer 40 is disposed between the active layer 30 and the contact layer 50. The second mirror layer 40 is, for example, a second conductivity type semiconductor layer. The second conductivity type is, for example, a p-type. The second mirror layer 40 is a distributed bragg reflection type mirror. The second mirror layer 40 is constituted by alternately laminating high refractive index layers 44 and low refractive index layers 46. The high refractive index layer 44 is, for example, a p-type $Al_{0.12}Ga_{0.88}As$ layer doped with carbon. The low refractive index layer 46 is, for example, a p-type $Al_{0.9}Ga_{0.1}As$ layer doped with carbon. The lamination number of the high refractive index layers 44 and the low refractive index layers 46 is, for example, 3 pairs or more and 40 pairs or less.

The second mirror layer 40, the active layer 30, and the first mirror layer 20 constitute a vertical resonator type pin diode. When a forward voltage of a pin diode is applied between the first electrode 80 and the second electrode 82, recombination of electrons and holes occurs in the active layer 30 and light emission occurs. The light generated in the active layer 30 is subjected to multiple reflection between the first mirror layer 20 and the second mirror layer 40, and stimulated emission occurs at this time, and the intensity is amplified. When the optical gain exceeds the optical loss, laser oscillation occurs, and laser light is emitted from the upper surface of the contact layer 50.

The current confinement layer 42 is disposed between the first mirror layer 20 and the second mirror layer 40. The current confinement layer 42 is disposed between the active layer 30 and the second mirror layer 40. The current confinement layer 42 may be disposed over the active layer 30 or may be disposed inside the second mirror layer 40, for example. The current confinement layer 42 is an to-be-oxidized layer of the $Al_xGa_{1-x}As$ layer when x≥0.95, for example. The current confinement layer 42 has an opening 43 that serves as a current path. The current confinement layer 42 can prevent the current injected into the active layer 30 from spreading within the surface of the active layer 30.

The contact layer 50 is disposed over the second mirror layer 40. The contact layer 50 is a p-type semiconductor layer. Specifically, the contact layer 50 is a p-type GaAs layer doped with carbon.

As illustrated in FIG. 4, the first region 60 is provided on the side of the first mirror layer 20 that constitutes the laminated body 2. The first region 60 includes a plurality of first oxidized layers 6 provided continuously with the first mirror layer 20. Specifically, the first region 60 is constituted such that the first oxidized layer 6 in which a layer continuous with the low refractive index layer 26 that constitutes the first mirror layer 20 is oxidized, and a layer 4 continuous with the high refractive index layer 24 that constitutes the first mirror layer 20 are alternately laminated.

The second region 62 is provided on the side of the second mirror layer 40 that constitutes the laminated body 2. The second region 62 includes a plurality of second oxidized layers 16 provided continuously with the second mirror layer 40. Specifically, the second region 62 is constituted such that the second oxidized layer 16 in which a layer continuous with the low refractive index layer 46 that constitutes the second mirror layer 40 is oxidized, and a layer 14 continuous with the high refractive index layer 44 that constitutes the second mirror layer 40 are alternately laminated.

The first region 60 and the second region 62 constitute an oxidized region 8. The oxidized region 8 is provided along the outer edge of the laminated body 2 as illustrated in FIG. 3. As illustrated in FIG. 4, an upper surface 63 of the oxidized region 8 is inclined with respect to an upper surface 48 of the second mirror layer 40.

Apart of the first mirror layer 20, the active layer 30, the second mirror layer 40, the current confinement layer 42, the contact layer 50, the first region 60, and the second region 62 constitute the laminated body 2. As illustrated in FIG. 2, the laminated body 2 is columnar. The laminated body 2 is disposed over the first mirror layer 20 and protrudes upward from the first mirror layer 20. The laminated body 2 is surrounded by the resin layer 70.

As illustrated in FIG. 3, the laminated body 2 has a first part 2a, a second part 2b, and a third part 2c in a plan view. In addition, the plan view refers to viewing along an axis perpendicular to the substrate 10, and in the illustrated example, refers to viewing along the Z axis. The Z axis is an axis perpendicular to the substrate 10, and the X axis and the Y axis are axes perpendicular to the Z axis and perpendicular to each other.

In the illustrated example, the first part 2a, the second part 2b, and the third part 2c are arranged along the Y axis in a plan view. The third part 2c is disposed between the first part 2a and the second part 2b. The first part 2a protrudes from the third part 2c to one side along the Y axis. The second part 2b protrudes from the third part 2c to the other side along the Y axis. The first part 2a and the second part 2b have, for example, the same shape in a plan view.

The first part 2a is connected to the third part 2c. The second part 2b is connected to the third part 2c. In other words, the first part 2a, the second part 2b, and the third part 2c are provided integrally. The first part 2a has the first region 60 and the second region 62. The second part 2b has the first region 60 and the second region 62.

As illustrated in FIGS. 2 and 3, the third part 2c has a fourth part 2d, a fifth part 2e, and a sixth part 2f in a plan view.

The fourth part 2d has the first region 60 and the second region 62. The fourth part 2d has, for example, an arc-shaped outer edge 3d in a plan view.

The fifth part 2e has the first region 60 and the second region 62. The fifth part 2e is separated from the fourth part 2d. The fifth part 2e has, for example, an arc-shaped outer edge 3e in a plan view.

The sixth part 2f is disposed between the fourth part 2d and the fifth part 2e in a plan view. The sixth part 2f is sandwiched between the first part 2a and the second part 2b in a plan view. In other words, the sixth part 2f is a part sandwiched between a first virtual straight line V1 along the Y axis connecting one outer edge of two outer edges that oppose the first part 2a and one outer edge of two outer edges that oppose the second part 2b to each other, and a second virtual straight line V2 along a Y axis connecting the other outer edge of two outer edges that oppose the first part 2a and the other outer edge of two outer edges that oppose the second part 2b to each other. In the illustrated example, the maximum width along the X axis of the sixth part 2f is the same as the maximum width along the X axis of the first part 2a and the maximum width along the X axis of the second part 2b. The sixth part 2f is connected to the first part 2a, the second part 2b, the fourth part 2d, and the fifth part 2e.

A first groove 90 is provided at the fourth part 2d. The first groove 90 is provided along the outer edge 3d of the fourth part 2d in a plan view. One end 90a and the other end 90b of the first groove 90 are positioned at the sixth part 2f. In other words, the first groove 90 is also provided at the sixth part 2f. In the illustrated example, the first groove 90 is provided along the outer edge 3d from the one end 90a positioned at the sixth part 2f to the other end 90b. The first part 2a and the sixth part 2f are not divided by the first groove 90. The second part 2b and the sixth part 2f are not divided by the first groove 90. In the illustrated example, the first groove 90 is separated from the oxidized region 8.

A second groove 92 is provided at the fifth part 2e. The second groove 92 is provided along the outer edge 3e of the fifth part 2e in a plan view. One end 92a and the other end 92b of the second groove 92 are positioned at the sixth part 2f. In other words, the second groove 92 is also provided at the sixth part 2f. In the illustrated example, the second groove 92 is provided along the outer edge 3e from the one end 92a to the other end 92b positioned at the sixth part 2f. The first part 2a and the sixth part 2f are not divided by the second groove 92. The second part 2b and the sixth part 2f are not divided by the second groove 92. The second groove 92 is separated from the first groove 90. In the illustrated example, the second groove 92 is separated from the oxidized region 8.

The third part 2c resonates the light generated in the active layer 30. In other words, a resonator is formed at the third part 2c. For example, in a plan view, a resonator is formed at an inner part than the first groove 90 and the second groove 92 of the third part 2c. The planar shape of the third part 2c is, for example, a circle. The laminated body 2 is symmetric with respect to a virtual straight line passing through the center of the opening 43 and parallel to the X axis, for example, in a plan view. The laminated body 2 is symmetric with respect to a virtual straight line passing through the center of the opening 43 and parallel to the Y axis, for example, in a plan view.

As illustrated in FIG. 2, a depth H1 of the first groove 90 and a depth H2 of the second groove 92 are equal to or greater than a thickness T of the laminated body 2. In the illustrated example, the depths H1 and H2 and the thickness T are the same as each other. Although not illustrated, the depths H1 and H2 may be greater than the thickness T. The depth H1 is the size along the Z axis of the first groove 90. The depth H2 is the size along the Z axis of the second groove 92. The thickness T is the size along the Z axis of the laminated body 2. The starting points of the depths H1 and H2 and the thickness T are all the surface of the contact layer 50. The first groove 90 and the second groove 92 reach the first mirror layer 20. In the illustrated example, the first groove 90 and the second groove 92 are filled with the resin layer 70.

In the semiconductor laser 100, distortion can be applied to the active layer 30 by the first part 2a and the second part 2b. When the first part 2a and the second part 2b apply distortion to the active layer 30, stress is generated in the active layer 30 in a predetermined direction. Specifically, tensile stress is generated in the active layer 30. As a result, the third part 2c that constitutes the resonator is not optically isotropic, and the light generated in the active layer 30 is polarized. Accordingly, the polarized light of the light generated in the active layer 30 can be stabilized. Here, polarizing the light means making the vibration direction of the electric field of light constant.

As illustrated in FIG. 2, the resin layer 70 is disposed over at least the side surface of the laminated body 2. In the example illustrated in FIG. 1, the resin layer 70 covers the first part 2a and the second part 2b. In the example illustrated in FIG. 2, the resin layer 70 is disposed over the side surface of the fourth part 2d and the side surface of the fifth part 2e. The material of the resin layer 70 is, for example, polyimide. Since the volume of the polyimide shrinks by substantially 60% to 70% due to hardening shrinkage, the tensile stress generated at the third part 2c by the first part 2a and the second part 2b can be promoted.

The first electrode 80 is disposed over the first mirror layer 20. The first electrode 80 is in ohmic contact with the first mirror layer 20. The first electrode 80 is electrically coupled to the first mirror layer 20. As the first electrode 80, a member constituted by laminating a Cr layer, a Pt layer, a Ti layer, a Pt layer, and an Au layer in order from the first mirror layer 20 side is used, for example. The first electrode 80 is one electrode for injecting a current into the active layer 30. Although not illustrated, the first electrode 80 may be provided on the lower surface of the substrate 10.

The second electrode 82 is disposed over the contact layer 50. The second electrode 82 is in ohmic contact with the contact layer 50. In the illustrated example, the second electrode 82 is further disposed over the resin layer 70. The second electrode 82 is electrically coupled to the second mirror layer 40 through the contact layer 50. The second electrode 82 overlaps a part 5d outer than the first groove 90 of the fourth part 2d and the part 5e outer than the second groove 92 of the fifth part 2e in a plan view. As the second electrode 82, for example, a layer in which a Cr layer, a Pt layer, a Ti layer, a Pt layer, and an Au layer are laminated in order from the contact layer 50 side is used. The second electrode 82 is the other electrode for injecting a current into the active layer 30.

As illustrated in FIG. 1, the second electrode 82 is electrically coupled to a pad 84. In the illustrated example, the second electrode 82 is electrically coupled to the pad 84 via a lead wiring 86. The pad 84 and the lead wiring 86 are provided on the resin layer 70. The material of the pad 84 and the lead wiring 86 is the same as the material of the second electrode 82, for example.

Although the AlGaAs semiconductor laser has been described above, as the semiconductor laser according to the present disclosure, for example, GaInP-based, ZnSSe-based, InGaN-based, AlGaN-based, InGaAs-based, GaInNAs-based, or GaAsSb-based semiconductor material may be used corresponding to the oscillation wavelength.

1.2. Manufacturing Method of Semiconductor Laser

Next, a manufacturing method of the semiconductor laser 100 according to a first embodiment will be described with reference to the drawings. FIGS. 5 to 9 are sectional views schematically illustrating a manufacturing process of the semiconductor laser 100 according to the first embodiment.

Figure 5:
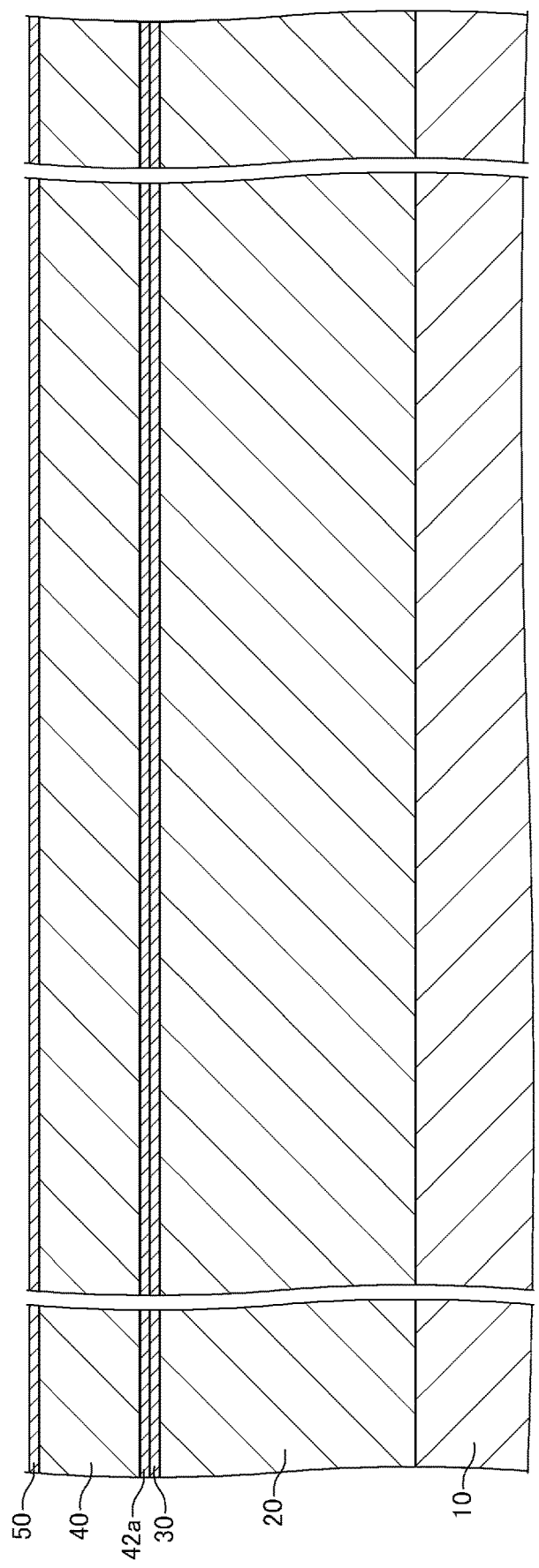
FIG. 5 is a sectional view schematically illustrating a manufacturing process of the semiconductor laser according to the first embodiment.

As illustrated in FIG. 5, the first mirror layer 20, the active layer 30, the to-be-oxidized layer 42a that is oxidized to become the current confinement layer 42, the second mirror layer 40, and the contact layer 50 are epitaxially grown on the substrate 10. Examples of the epitaxial growth method include a metal organic chemical vapor deposition (MOCVD) method, and a molecular beam epitaxy (MBE) method.

Figure 6:
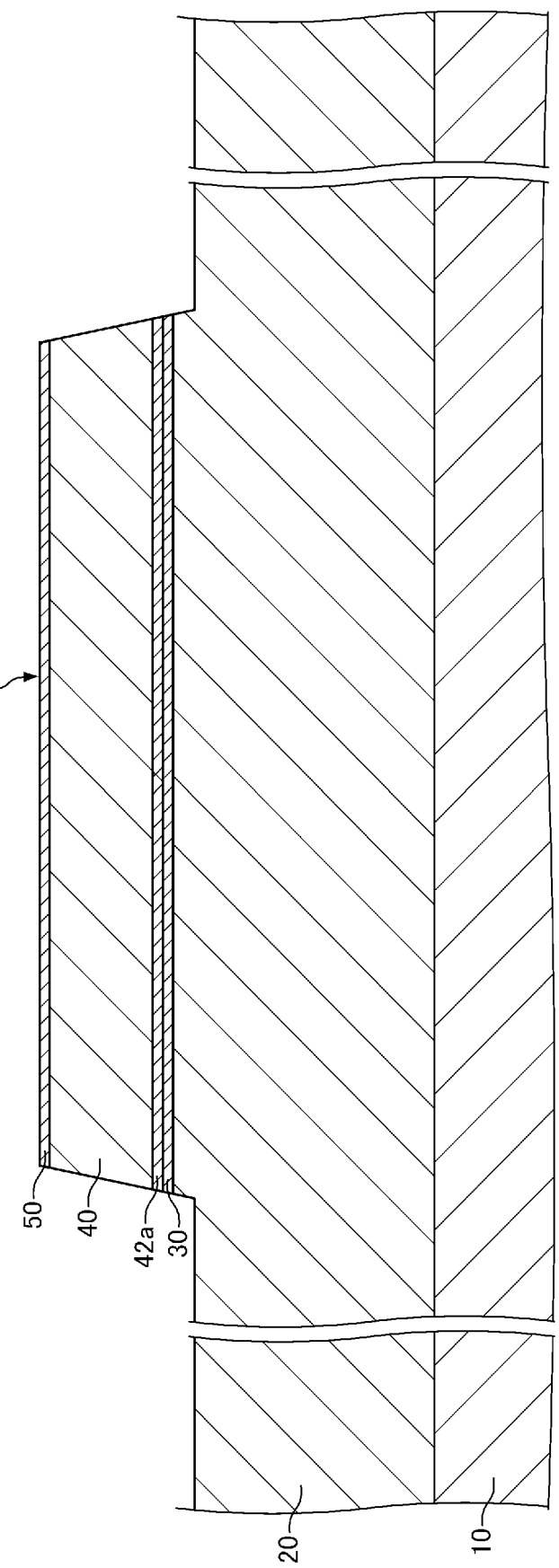
FIG. 6 is a sectional view schematically illustrating the manufacturing process of the semiconductor laser according to the first embodiment.

As illustrated in FIG. 6, the contact layer 50, the second mirror layer 40, the to-be-oxidized layer 42a, the active layer 30, and the first mirror layer 20 are patterned to form the laminated body 2. The patterning is performed by, for example, photolithography and etching.

Figure 7:
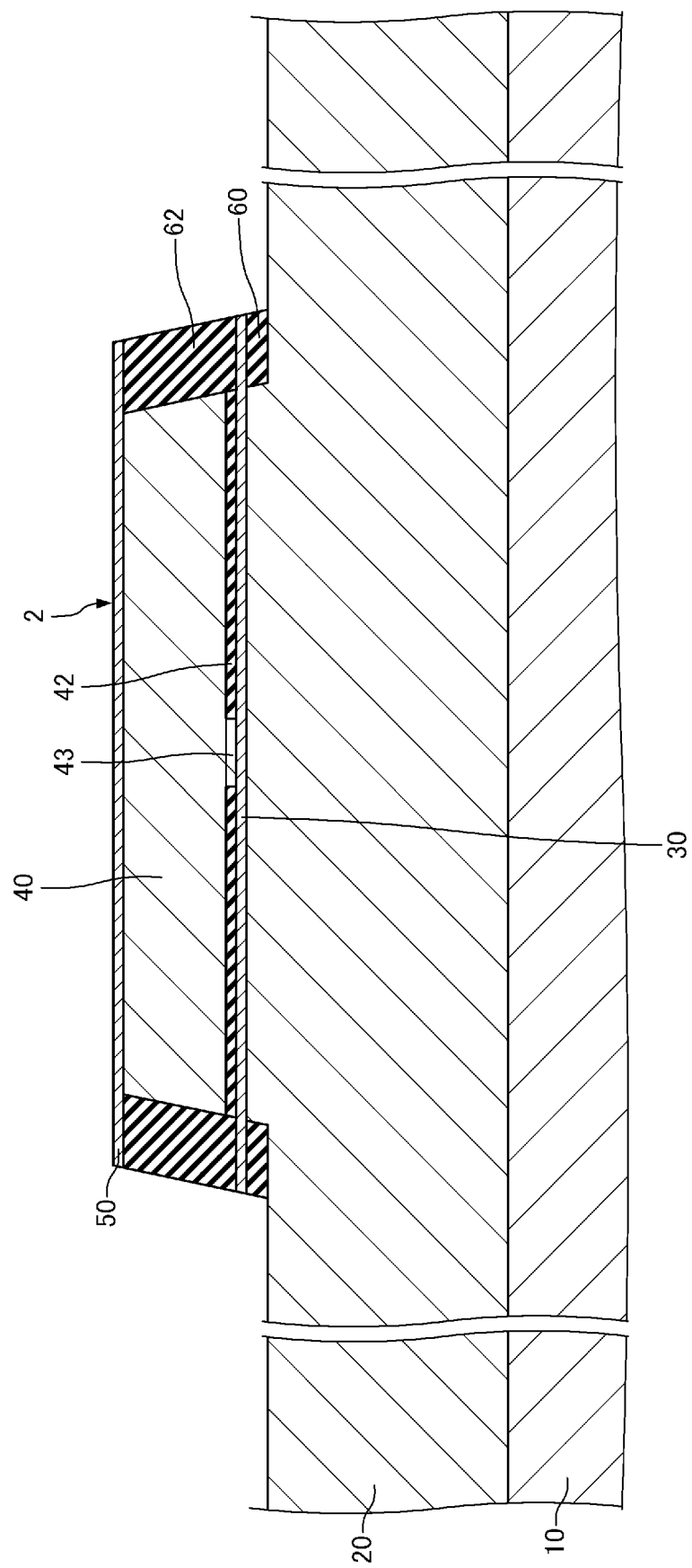
FIG. 7 is a sectional view schematically illustrating the manufacturing process of the semiconductor laser according to the first embodiment.

As illustrated in FIG. 7, the to-be-oxidized layer 42a is oxidized to form the current confinement layer 42. The to-be-oxidized layer 42a is an $Al_xGa_{1-x}As$ layer when $x \geq 0.95$ is satisfied, for example. For example, the current confinement layer 42 is formed by oxidizing the $Al_xGa_{1-x}As$ layer from the side surface by putting the substrate 10 provided with the laminated body 2 in a water vapor atmosphere at substantially 400° C.

In the oxidation process of oxidizing the to-be-oxidized layer 42a to form the current confinement layer 42, arsenic in the $Al_{0.9}Ga_{0.1}As$ layer that constitutes the first mirror layer 20 is replaced with oxygen, and as illustrated in FIG. 4, the first oxidized layer 6 is formed. As a result, the first region 60 is formed. Similarly, arsenic in the $Al_{0.9}Ga_{0.1}As$ layer that constitutes the second mirror layer 40 is replaced with oxygen, and as illustrated in FIG. 4, the second oxidized layer 16 is formed. As a result, the second region 62 is formed.

The volume of the first region 60 and the second region 62 is reduced by replacing arsenic with oxygen. Accordingly, the upper surface 63 of the second region 62 is inclined. Specifically, the first region 60 and the second region 62 are reduced in distance between lattices due to strong electronegativity due to the replacement of arsenic with oxygen, and the volume is reduced by substantially 30%. For convenience, FIGS. 7 to 9 illustrate the first region 60 and the second region 62 in a simplified manner.

Figure 8:
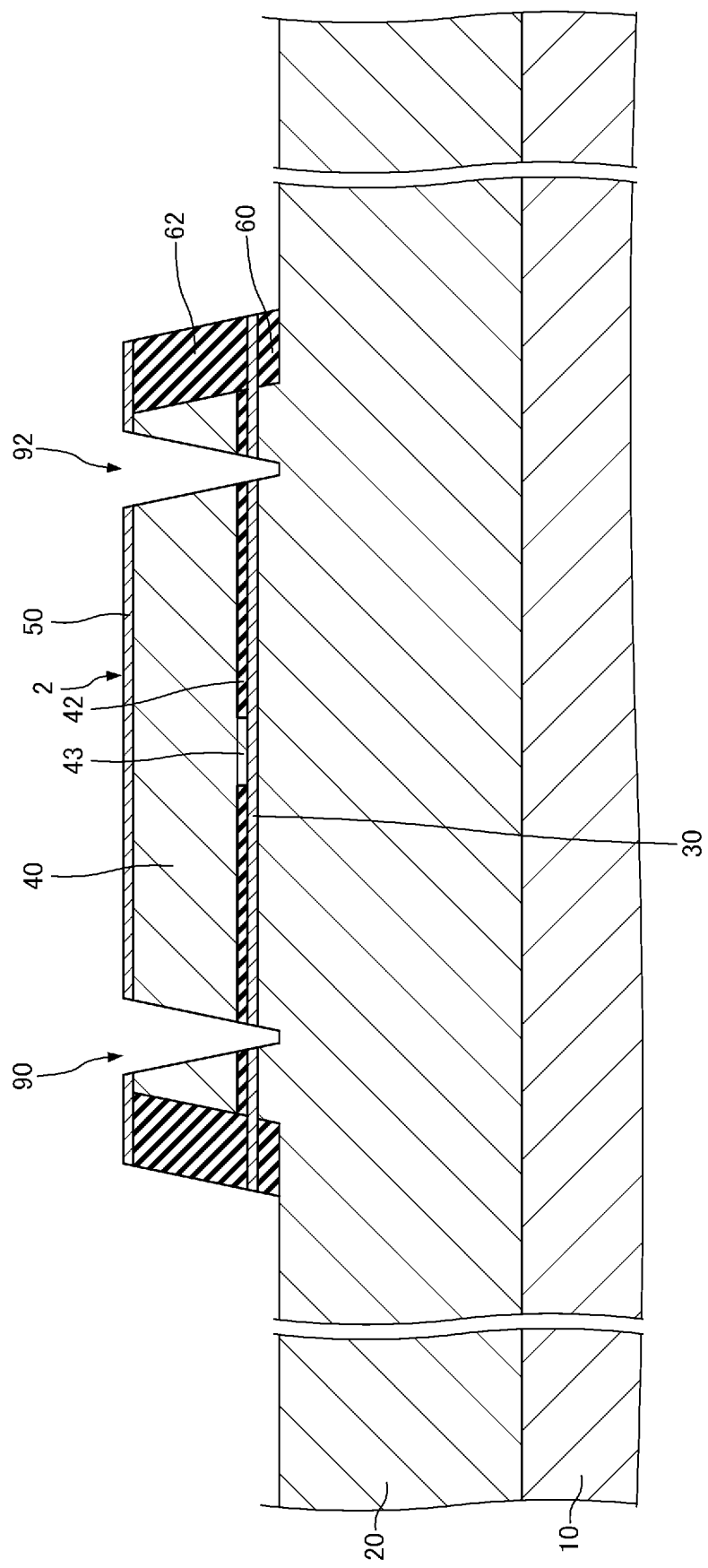
FIG. 8 is a sectional view schematically illustrating the manufacturing process of the semiconductor laser according to the first embodiment.

As illustrated in FIG. 8, the laminated body 2 is patterned to form the first groove 90 and the second groove 92. The patterning is performed by, for example, photolithography and etching. The etching is, for example, wet etching using ammonia addition water or dry etching using $CF_4$, $CHF_3$, or $C_4F_8$.

Figure 9:
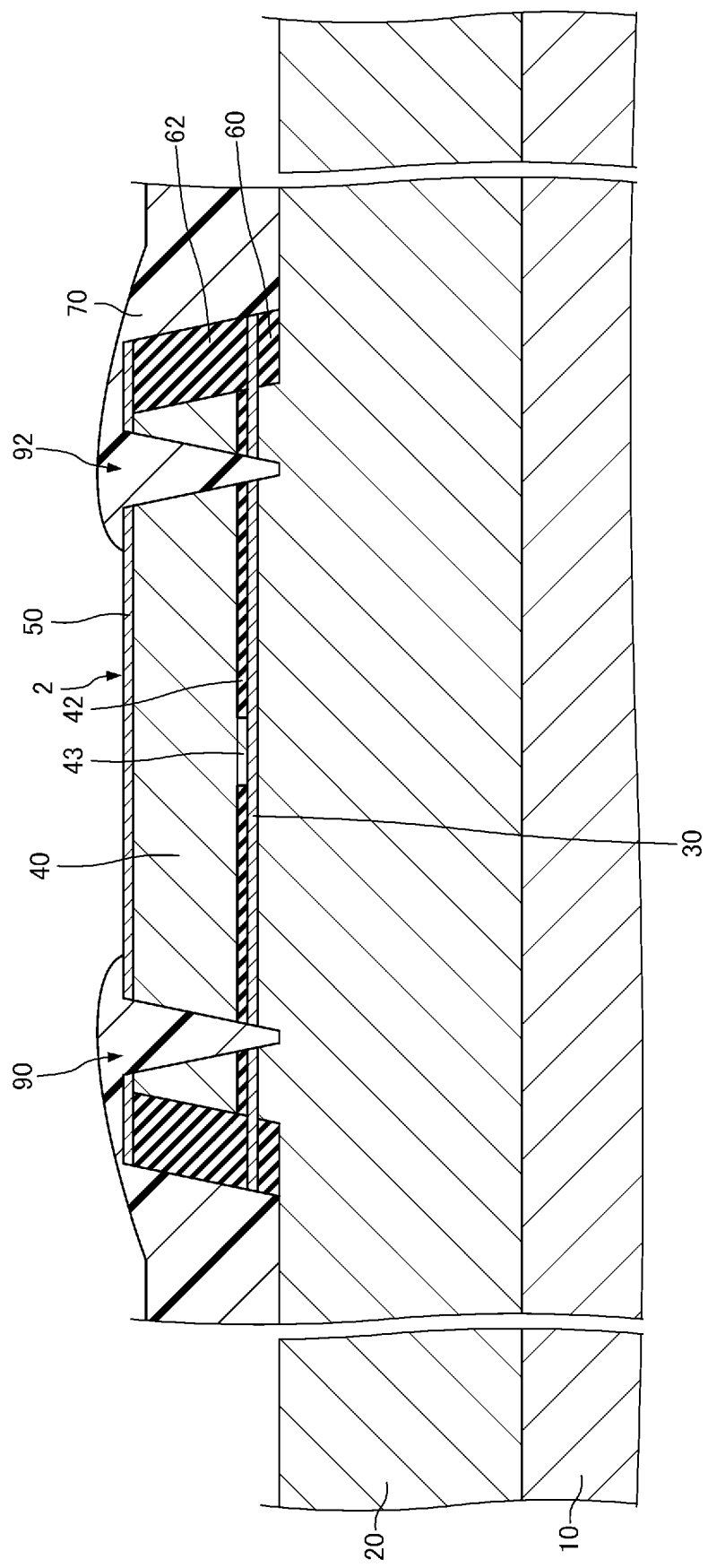
FIG. 9 is a sectional view schematically illustrating the manufacturing process of the semiconductor laser according to the first embodiment.

As illustrated in FIG. 9, the resin layer 70 is formed so as to surround the laminated body 2. The resin layer 70 is formed, for example, by forming a layer made of polyimide resin or the like on the upper surface of the first mirror layer 20 and the entire surface of the laminated body 2 by using a spin coating method or the like, and patterning the layer. The patterning is performed by, for example, photolithography and etching. Next, the resin layer 70 is hardened by heat treatment. By this heat treatment, the resin layer 70 shrinks. Furthermore, the resin layer 70 shrinks when the temperature is returned from the heat treatment to room temperature.

As illustrated in FIG. 2, the second electrode 82 is formed on the contact layer 50 and the resin layer 70, and the first electrode 80 is formed on the first mirror layer 20. The first electrode 80 and the second electrode 82 are formed by, for example, a combination of a vacuum deposition method and a lift-off method. An order of forming the first electrode 80 and the second electrode 82 is not particularly limited.

Further, in the process of forming the second electrode 82, the pad 84 and the lead wiring 86 illustrated in FIG. 1 may be formed.

Through the processes above, the semiconductor laser 100 can be manufactured.

1.3. Effects

The semiconductor laser 100 has the following effects, for example.

In the semiconductor laser 100, the third part 2c includes the fourth part 2d having the first region 60 and the second region 62, the fifth part 2e having the first region 60 and the second region 62, and the sixth part 2f disposed between the fourth part 2d and the fifth part 2e and sandwiched between the first part 2a and the second part 2b in a plan view, the first groove 90 is provided at the fourth part 2d, and the second groove 92 is provided at the fifth part 2e. Here, as described above, the volume of the first region 60 and the second region 62 shrinks in the oxidation process. In the semiconductor laser 100, the first groove 90 is provided at the fourth part 2d, and the second groove 92 is provided at the fifth part 2e. Therefore, the force generated in the first region 60 and the second region 62 of the fourth part 2d and the first region 60 and the second region 62 of the fifth part 2e due to the shrinkage of the volume can be unlikely to be transmitted to the sixth part 2f. Accordingly, in the semiconductor laser 100, compared to a case where the first groove 90 and the second groove 92 are not provided, the stress generated at the sixth part 2f can be reduced. Accordingly, the occurrence of defects in the active layer 30 of the sixth part 2f can be reduced. Therefore, it is possible to prevent defects from occurring in the active layer 30 of the sixth part 2f and the characteristics of the semiconductor laser 100, such as the wavelength or the amount of light, from changing, and to provide the semiconductor laser 100 having a long life and stable polarization.

For example, when the first groove 90 and the second groove 92 are not provided, there is a case where dislocation occurs at the sixth part 2f due to stress caused by the oxidized region 8 of the fourth part 2d and the fifth part 2e.

In the semiconductor laser 100, the first groove 90 is provided along the outer edge 3d of the fourth part 2d and the second groove 92 is provided along the outer edge 3e of the fifth part 2e in a plan view. Therefore, in the semiconductor laser 100, compared to a case where the first groove 90 is not provided along the outer edge 3d and the second groove 92 is not provided along the outer edge 3e, the stability of the mode formed by the resonator can be increased. For example, compared to a case where the outer edge 3d and the outer edge 3e have a circular shape in a plan view and the first groove 90 and the second groove 92 are straight lines along the Y axis, the stability of the mode formed by the resonator can be improved.

In the semiconductor laser 100, one end 90a and the other end 90b of the first groove 90 are positioned at the sixth part 2f, and one end 92a and the other end 92b of the second groove 92 are positioned at the sixth part 2f. Therefore, in the semiconductor laser 100, compared to a case where the first groove 90 and the second groove 92 are not provided at the sixth part 2f, the stress generated at the sixth part 2f by the first region 60 and the second region 62 of the fourth part 2d and the first region 60 and the second region 62 of the fifth part 2e can be reduced.

In the semiconductor laser 100, the depth H1 of the first groove 90 and the depth H2 of the second groove 92 are equal to or greater than the thickness T of the laminated body 2. Therefore, in the semiconductor laser 100, compared to a case where the depths H1 and H2 are smaller than the thickness T, the force generated in the first region 60 and the second region 62 due to the shrinkage of the volume can be more unlikely to be transmitted the sixth part 2f. Therefore, compared to a case where the depths H1 and H2 are smaller than the thickness T, the stress generated at the sixth part 2f by the first region 60 and the second region 62 of the fourth part 2d and the first region 60 and the second region 62 of the fifth part 2e can be further reduced. In addition, the depths H1 and H2 may be smaller than the thickness T. When the depths H1 and H2 are smaller than the thickness T, the generation of defects due to the exposure of the active layer 30 can be reduced by making the depths H1 and H2 shallower than the thickness from the contact layer 50 to the active layer 30.

The semiconductor laser 100 includes a resin layer 70 disposed at the fourth part 2d and the fifth part 2e. Therefore, in the semiconductor laser 100, since a part of the force generated by the shrinkage of the resin layer 70 is applied to the fourth part 2d and the fifth part 2e, the stress generated at the sixth part 2f by the resin layer 70 can be reduced by the fourth part 2d and the fifth part 2e.

Figure 10:
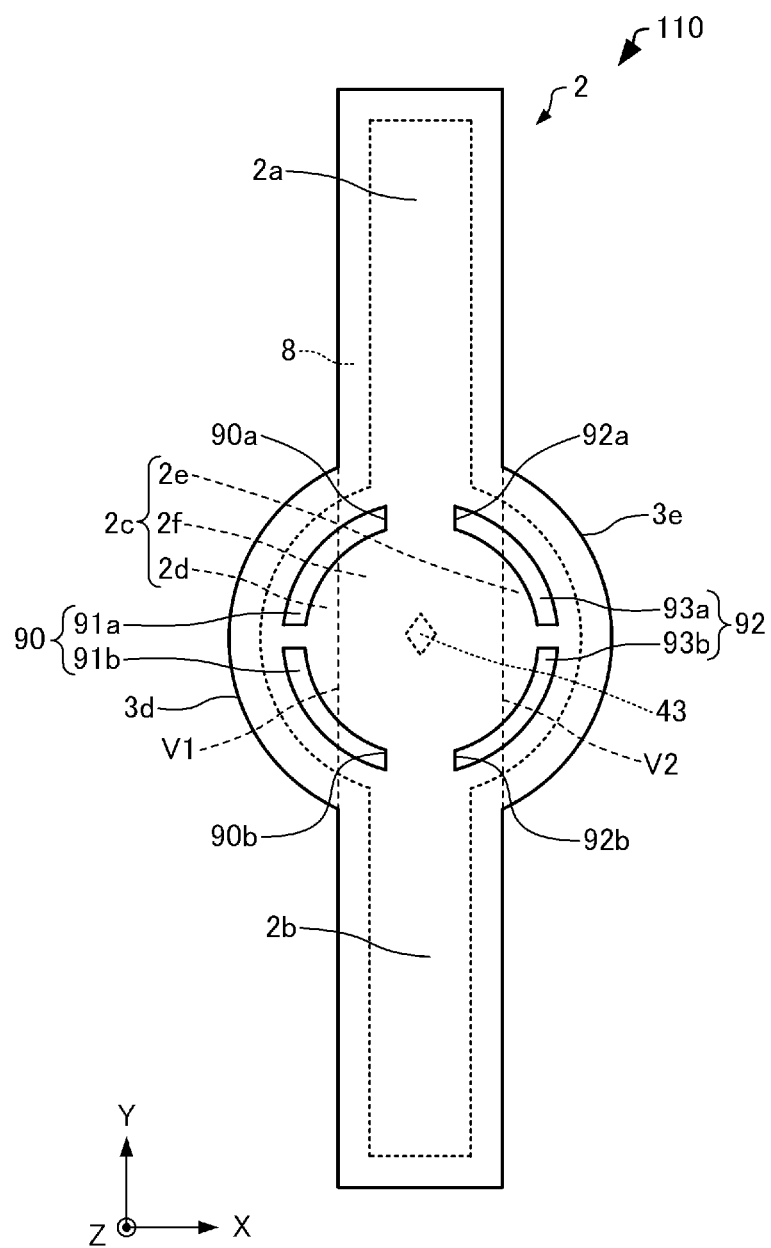
FIG. 10 is a plan view schematically illustrating a semiconductor laser according to a first modification example of the first embodiment.

1.4. Modification Example of Semiconductor Laser 1.4.1. First Modification Example Next, the semiconductor laser according to a first modification example of the first embodiment will be described with reference to the drawings. FIG. 10 is a plan view schematically illustrating a semiconductor laser 110 according to the first modification example of the first embodiment. For convenience, illustration of members other than the laminated body 2 is omitted in FIG. 10.

Hereinafter, in the semiconductor laser 110 according to the first modification example of the first embodiment, points different from the example of the semiconductor laser 100 according to the above-described first embodiment will be described, the same points will be given the same reference numerals, and the description thereof will be omitted. This is the same in the semiconductor laser according to second, third, and fourth modification examples, which will be described later, of the first embodiment.

In the above-described semiconductor laser 100, as illustrated in FIG. 3, the first groove 90 is continuously provided from one end 90a to the other end 90b positioned at the sixth part 2f in a plan view. The second groove 92 is continuously provided from the one end 92a to the other end 92b positioned at the sixth part 2f.

In contrast, in the semiconductor laser 110, as illustrated in FIG. 10, the first groove 90 includes a third groove 91a and a fourth groove 91b separated from the third groove 91a. The second groove 92 includes a fifth groove 93a and a sixth groove 93b separated from the fifth groove 93a.

The first groove 90 is a discontinuous groove divided into the third groove 91a and the fourth groove 91b. The third groove 91a constitutes one end 90a of the first groove 90. The fourth groove 91b constitutes the other end 90b of the first groove 90.

The second groove 92 is a discontinuous groove divided into the fifth groove 93a and the sixth groove 93b. The fifth groove 93a constitutes one end 92a of the second groove 92. The sixth groove 93b constitutes the other end 92b of the second groove 92.

In the semiconductor laser 110, the first groove 90 includes the third groove 91a and the fourth groove 91b separated from the third groove 91a, and the second groove 92 includes the fifth groove 93a and the sixth groove 93b separated from the fifth groove 93a. Therefore, in the semiconductor laser 110, compared to a case where the third groove 91a and the fourth groove 91b are continuous with each other and the fifth groove 93a and the sixth groove 93b are continuous with each other, the mechanical intensity of the third part 2c can be improved.

1.4.2. Second Modification Example

Figure 11:
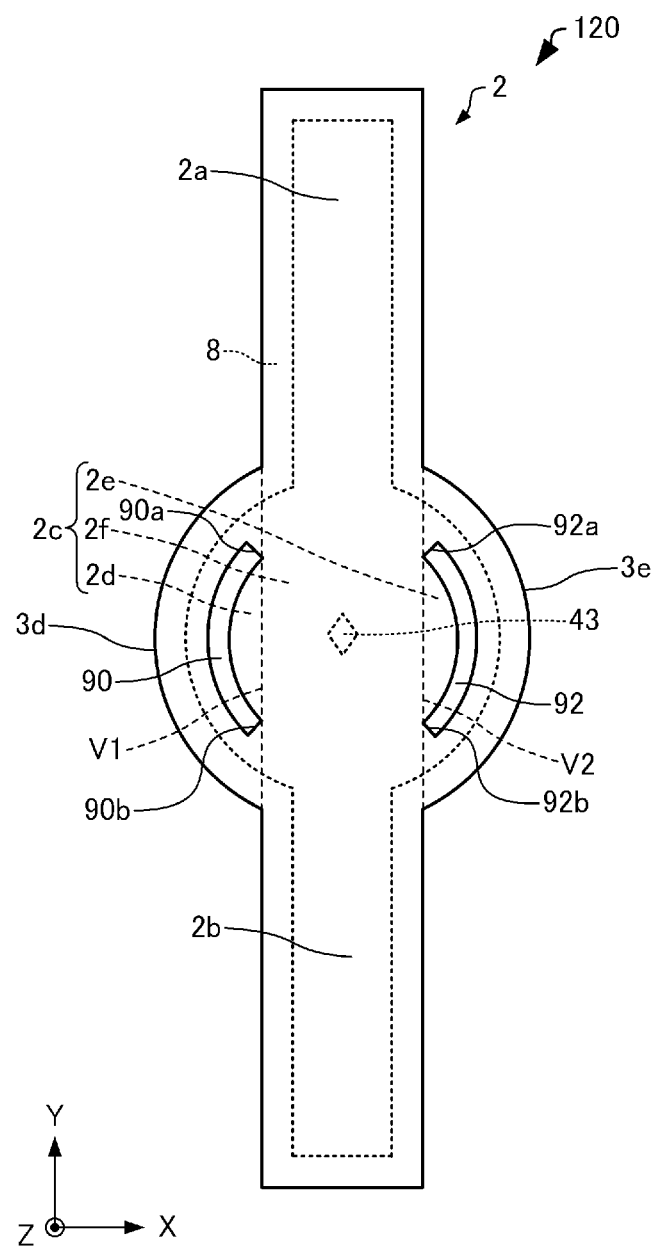
FIG. 11 is a plan view schematically illustrating a semiconductor laser according to a second modification example of the first embodiment.

Next, the semiconductor laser according to a second modification example of the first embodiment will be described with reference to the drawings. FIG. 11 is a plan view schematically illustrating a semiconductor laser 120 according to the second modification example of the first embodiment. For convenience, illustration of members other than the laminated body 2 is omitted in FIG. 11.

In the above-described semiconductor laser 100, as illustrated in FIG. 3, the one end 90a and the other end 90b of the first groove 90 are positioned at the sixth part 2f, and the one end 92a and the other end 92b of the second groove 92 are positioned at the sixth part 2f.

In contrast, in the semiconductor laser 120, as illustrated in FIG. 11, the one end 90a and the other end 90b of the first groove 90 are positioned at the fourth part 2d. The first groove 90 is not provided at the sixth part 2f. The one end 92a and the other end 92b of the second groove 92 are positioned at the fifth part 2e. The second groove 92 is not provided at the sixth part 2f.

In the semiconductor laser 120, the first groove 90 and the second groove 92 are not provided at the sixth part 2f. Therefore, in the semiconductor laser 120, compared to a case where the first groove 90 and the second groove 92 are also provided at the sixth part 2f, the stress generated in the active layer 30 of the third part 2c by the first part 2a and the second part 2b can be increased. Accordingly, the polarized light of light generated in the active layer 30 can be further stabilized.

1.4.3. Third Modification Example

Figure 12:
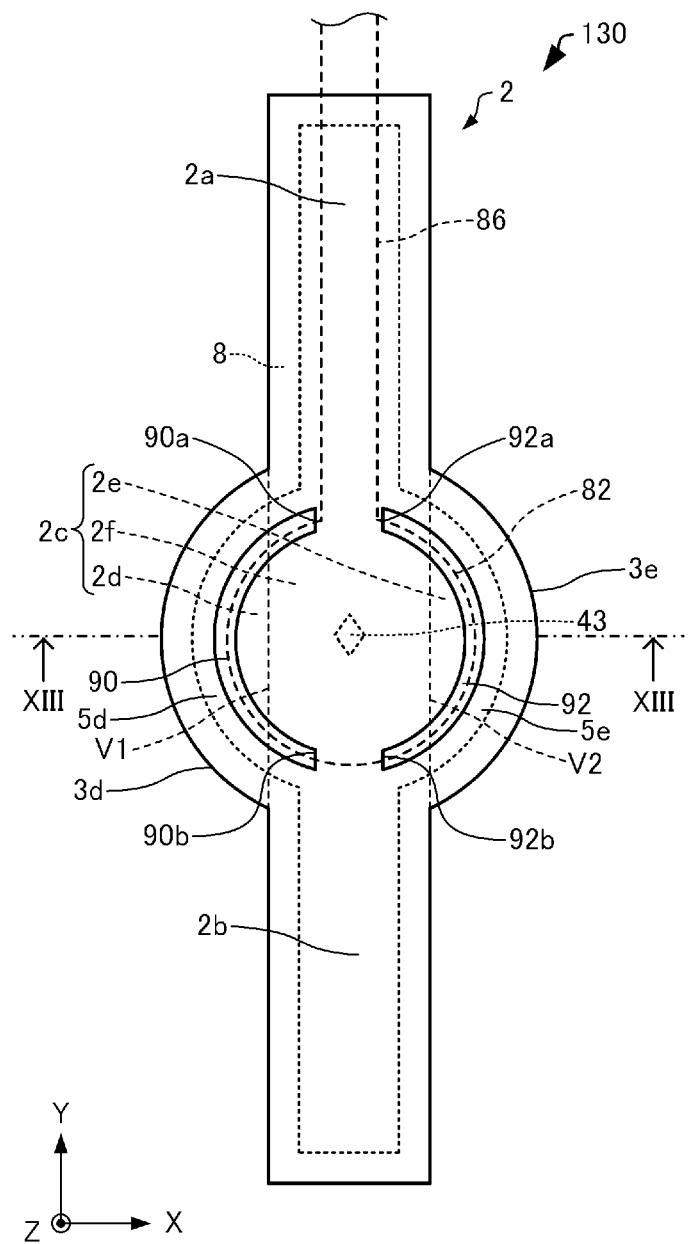
FIG. 12 is a plan view schematically illustrating a semiconductor laser according to a third modification example of the first embodiment.
Figure 13:
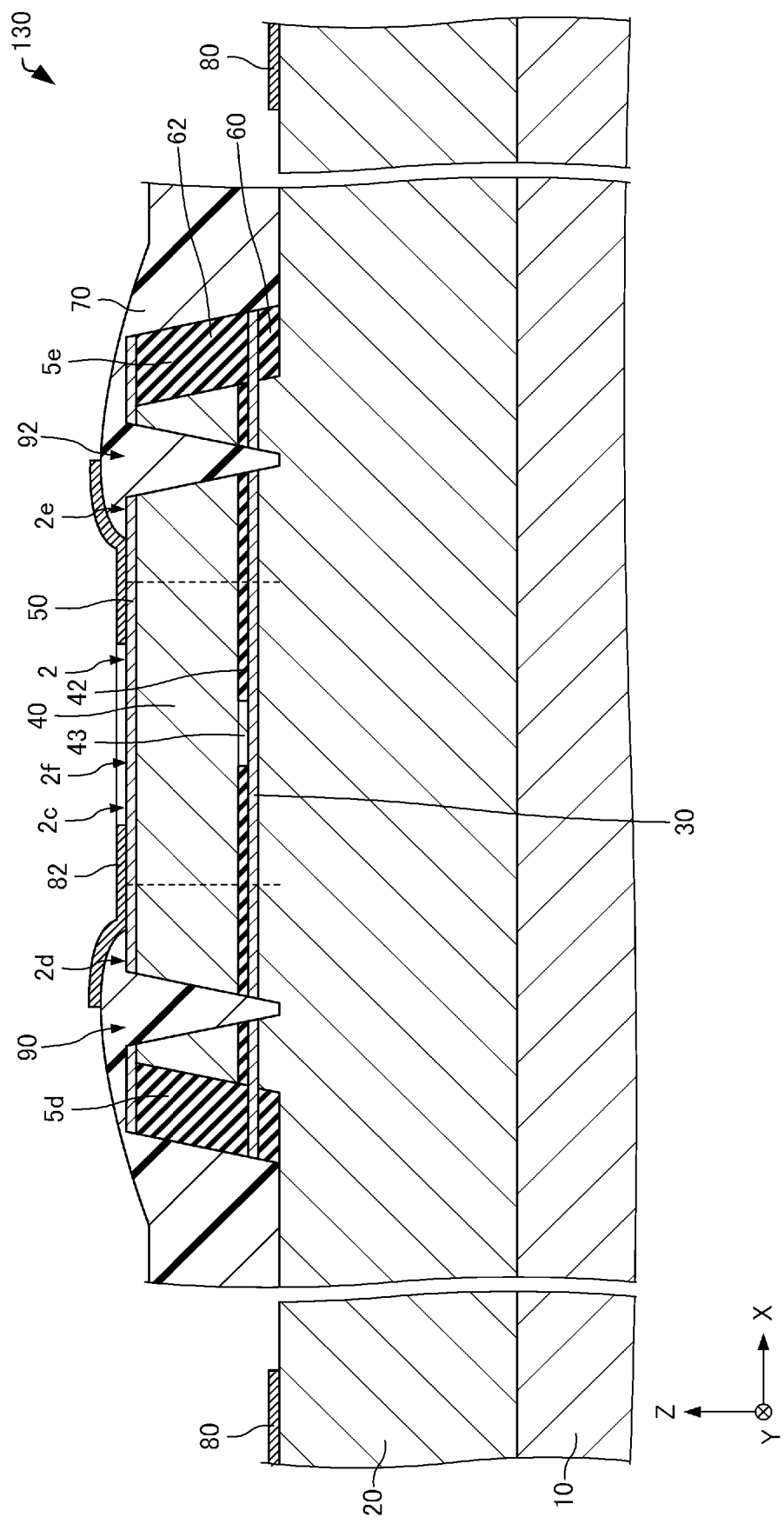
FIG. 13 is a sectional view schematically illustrating a semiconductor laser according to a third modification example of the first embodiment.

Next, the semiconductor laser according to a third modification example of the first embodiment will be described with reference to the drawings. FIG. 12 is a plan view schematically illustrating a semiconductor laser 130 according to the third modification example of the first embodiment. FIG. 13 is a sectional view taken along the line XIII-XIII of FIG. 12, schematically illustrating the semiconductor laser 130 according to the third modification example of the first embodiment. For convenience, illustration of members other than the laminated body 2, the second electrode 82, and the lead wiring 86 is omitted in FIG. 13. In FIG. 13, the second electrode 82 and the lead wiring are illustrated in a transparent manner, the second electrode 82 and the lead wiring 86 are indicated by a broken line, and the oxidized region 8 is indicated by a dotted line, respectively.

In the above-described semiconductor laser 100, as illustrated in FIG. 2, the second electrode 82 overlaps a part 5d outer than the first groove 90 of the fourth part 2d and the part 5e outer than the second groove 92 of the fifth part 2e in a plan view.

In contrast, in the semiconductor laser 130, as illustrated in FIGS. 12 and 13, the second electrode 82 does not overlap the parts 5d and 5e in a plan view. In the illustrated example, the outer edge of the second electrode 82 is positioned in the first groove 90 and the second groove 92 in a plan view.

In the semiconductor laser 130, the second electrode 82 does not overlap the parts 5d and 5e in a plan view. Therefore, in the semiconductor laser 130, compared to a case where the second electrode 82 overlaps the parts 5d and 5e in a plan view, a region where the heat is transmitted to the resin layer 70 can be reduced even when the second electrode 82 generates heat. Accordingly, the stress generated in the active layer 30 of the third part 2c by the resin layer 70 can be reduced.

1.4.4. Fourth Modification Example

Figure 14:
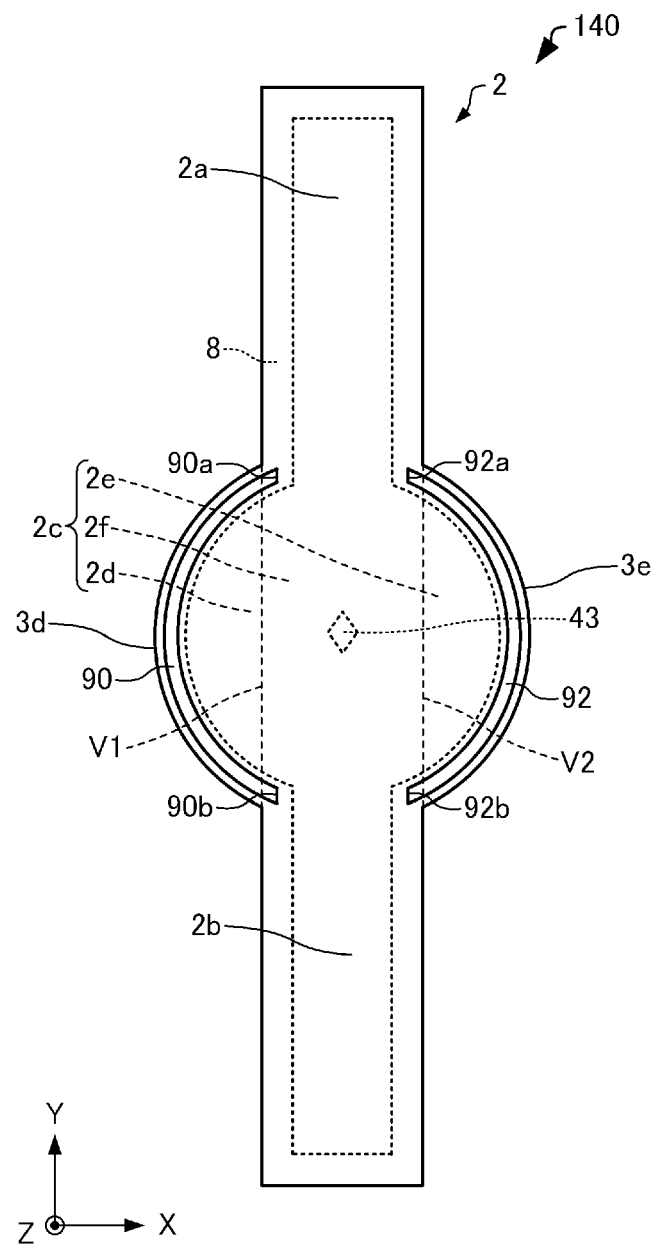
FIG. 14 is a plan view schematically illustrating a semiconductor laser according to a fourth modification example of the first embodiment.

Next, the semiconductor laser according to a fourth modification example of the first embodiment will be described with reference to the drawings. FIG. 14 is a plan view schematically illustrating a semiconductor laser 140 according to the fourth modification example of the first embodiment. For convenience, illustration of members other than the laminated body 2 is omitted in FIG. 14.

In the above-described semiconductor laser 100, as illustrated in FIG. 3, the first groove 90 is separated from the oxidized region 8, and the second groove 92 is separated from the oxidized region 8.

In contrast, in the semiconductor laser 140, as illustrated in FIG. 14, the first groove 90 is provided in the oxidized region 8 of the fourth part 2d. The second groove 92 is provided in the oxidized region 8 of the fifth part 2e.

In the illustrated example, the entire first groove 90 is provided in the oxidized region 8, but only a part of the first groove 90 may be provided in the oxidized region 8. Similarly, in the illustrated example, the entire second groove 92 is provided in the oxidized region 8, but only a part of the second groove 92 may be provided in the oxidized region 8.

2. Second Embodiment

Figure 15:
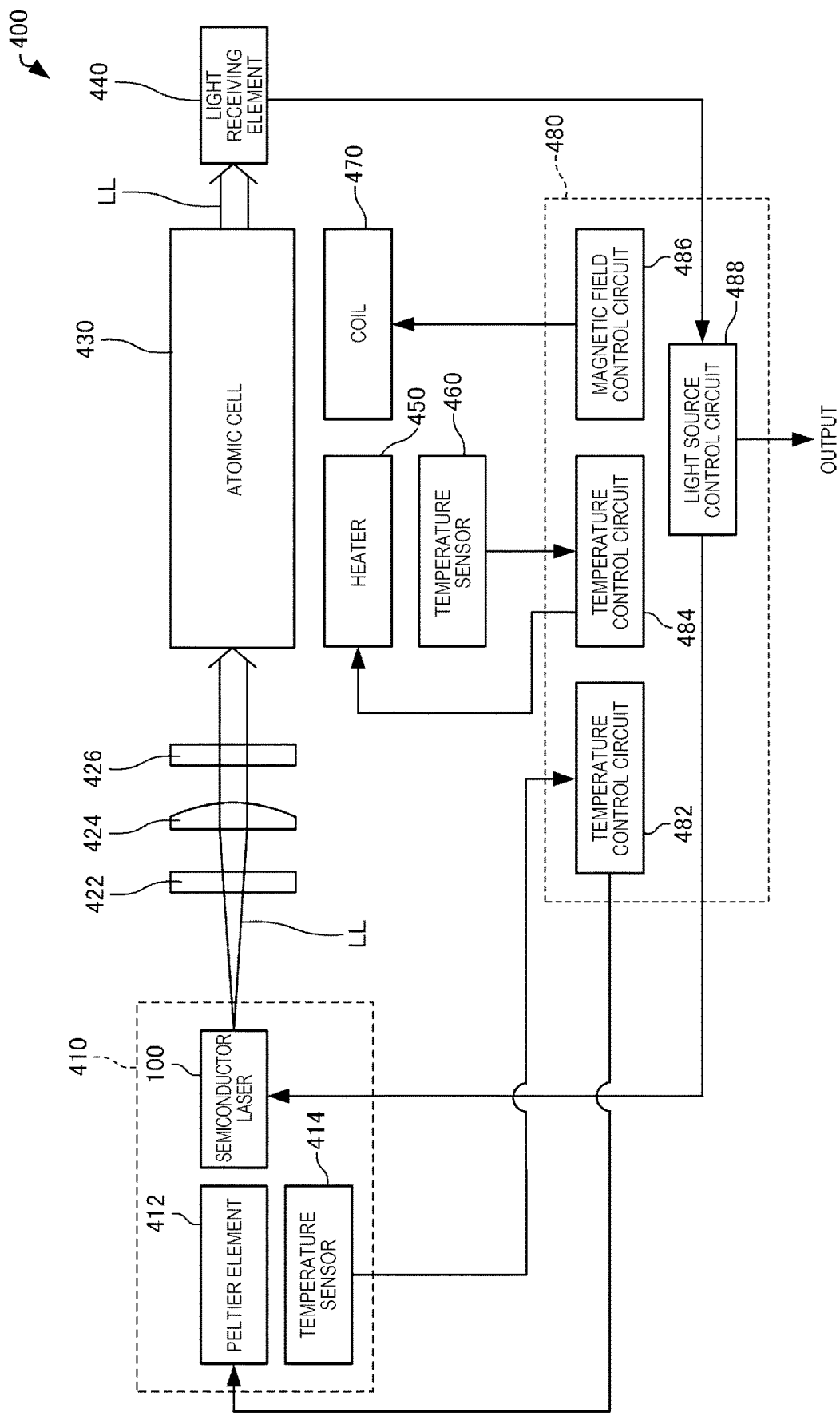
FIG. 15 is a view illustrating a configuration of an atomic oscillator according to a second embodiment.

Next, an atomic oscillator according to a second embodiment will be described with reference to the drawings. FIG. 15 is a view illustrating a configuration of an atomic oscillator 400 according to the second embodiment.

The atomic oscillator 400 is an atomic oscillator that uses a quantum interference effect (CPT: coherent population trapping) that causes a phenomenon in which, when an alkali metal atom is irradiated simultaneously with two rays of resonant light having specific different wavelengths, the two rays of resonant light are transmitted without being absorbed by the alkali metal atom. The phenomenon due to the quantum interference effect is also called an electromagnetically induced transparency (EIT) phenomenon. Further, the atomic oscillator according to the present disclosure may be an atomic oscillator using a double resonance phenomenon by light and microwave.

The atomic oscillator 400 includes the semiconductor laser 100 according to the first embodiment.

As illustrated in FIG. 15, the atomic oscillator 400 includes a light emitting element module 410, a neutral density filter 422, a lens 424, a quarter wavelength plate 426, an atom cell 430, a light receiving element 440, a heater 450, a temperature sensor 460, a coil 470, and a control circuit 480.

The light emitting element module 410 includes a semiconductor laser 100, a Peltier element 412, and a temperature sensor 414. The semiconductor laser 100 emits linearly polarized light LL including two types of light having different frequencies. The temperature sensor 414 detects the temperature of the semiconductor laser 100. The Peltier element 412 controls the temperature of the semiconductor laser 100.

The neutral density filter 422 reduces the intensity of the light LL emitted from the semiconductor laser 100. The lens 424 adjusts a radiation angle of the light LL. Specifically, the lens 424 changes the light LL into parallel light. The quarter wavelength plate 426 converts two types of light having different frequencies included in the light LL from linearly polarized light to circularly polarized light.

The atom cell 430 is irradiated with the light emitted from the semiconductor laser 100. The atom cell 430 transmits the light LL emitted from the semiconductor laser 100. The atom cell 430 contains alkali metal atoms. The alkali metal atom has a three-level energy level constituted with two different ground levels and excited levels. The light LL emitted from the semiconductor laser 100 is incident on the atom cell 430 via the neutral density filter 422, the lens 424, and the quarter wavelength plate 426.

The light receiving element 440 detects the intensity of the excitation light LL transmitted through the atom cell 430 and outputs a detection signal that corresponds to the intensity of the light. As the light receiving element 440, for example, a photodiode can be used.

The heater 450 controls the temperature of the atom cell 430. The heater 450 heats the alkali metal atoms contained in the atom cell 430 to make at least apart of the alkali metal atoms into a gas state.

The temperature sensor 460 detects the temperature of the atom cell 430. The coil 470 generates a magnetic field that causes Zeeman splitting of a plurality of degenerated energy levels of alkali metal atoms in the atom cell 430. The coil 470 can improve the resolution by widening a gap between different energy levels in which the alkali metal atoms are degenerated by Zeeman splitting. As a result, the accuracy of the oscillation frequency of the atomic oscillator 400 can be improved.

The control circuit 480 includes a temperature control circuit 482, a temperature control circuit 484, a magnetic field control circuit 486, and a light source control circuit 488.

The temperature control circuit 482 controls energization to the Peltier element 412 based on the detection result of the temperature sensor 414 such that the temperature of the semiconductor laser 100 reaches a desired temperature. The temperature control circuit 484 controls energization to the heater 450 based on the detection result of the temperature sensor 460 such that the inside of the atom cell 430 reaches a desired temperature. The magnetic field control circuit 486 controls energization to the coil 470 such that the magnetic field generated by the coil 470 is constant.

The light source control circuit 488 controls the frequencies of the two types of light included in the light LL emitted from the semiconductor laser 100 based on the detection result of the light receiving element 440 such that the EIT phenomenon occurs. Here, when the two types of light become resonant light pairs having a frequency difference that corresponds to the energy difference between the two ground levels of the alkali metal atoms contained in the atom cell 430, the EIT phenomenon occurs. The light source control circuit 488 includes a voltage controlled oscillator of which oscillation frequency is controlled so as to be stabilized in synchronization with the control of two types of light frequencies, and outputs an output signal of the voltage controlled oscillator (VCO) as a clock signal of the atomic oscillator 400.

The control circuit 480 is provided, for example, on an integrated circuit (IC) chip mounted on a substrate (not illustrated). The control circuit 480 may be a single IC or a combination of a plurality of digital circuits or analog circuits.

The application of the semiconductor laser 100 is not limited to the light source of the atomic oscillator. The semiconductor laser 100 may be used as a laser for communication or distance measurement, for example.

3. Third Embodiment

Figure 16:
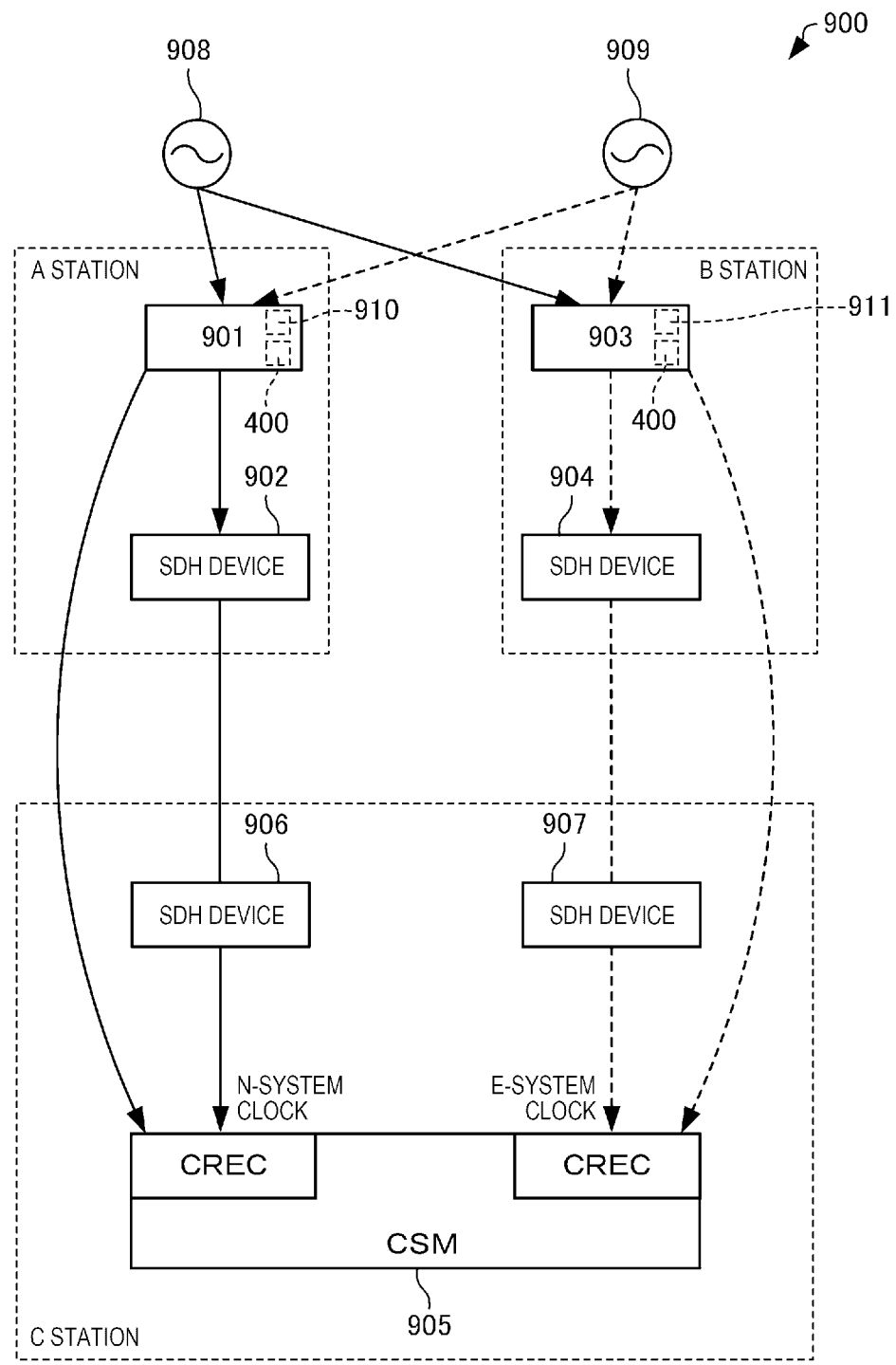
FIG. 16 is a view for describing an example of a frequency signal generation system according to a third embodiment.

Next, a frequency signal generation system according to a third embodiment will be described with reference to the drawings. The following clock transmission system as a timing server is an example of the frequency signal generation system. FIG. 16 is a schematic configuration view illustrating a clock transmission system 900.

The clock transmission system 900 includes an atomic oscillator 400 according to the second embodiment.

The clock transmission system 900 is a system that matches the clocks of each device in the time division multiplexing network, and has a redundant configuration of a normal (N) system and an emergency (E) system.

As illustrated in FIG. 16, the clock transmission system 900 includes a clock supply device 901 and a synchronous digital hierarchy (SDH) device 902 of an A station, a clock supply device 903 and an SDH device 904 of a B station, and a clock supply device 905 and SDH devices 906 and 907 of a C station. The clock supply device 901 includes the atomic oscillator 400 and generates an N-system clock signal. The clock supply device 901 has a terminal 910 to which a frequency signal from the atomic oscillator 400 is input. The atomic oscillator 400 in the clock supply device 901 generates a clock signal in synchronization with a more accurate clock signal from master clocks 908 and 909 including an atomic oscillator using cesium.

The SDH device 902 transmits and receives a main signal based on the clock signal from the clock supply device 901, superimposes the N-system clock signal on the main signal, and transmits the superimposed signal to the clock supply device 905 of the lower level. The clock supply device 903 includes the atomic oscillator 400 and generates an E-system clock signal. The clock supply device 903 has a terminal 911 to which a frequency signal from the atomic oscillator 400 is input. The atomic oscillator 400 in the clock supply device 903 generates a clock signal in synchronization with a more accurate clock signal from master clocks 908 and 909 including an atomic oscillator using cesium.

The SDH device 904 transmits and receives the main signal based on the clock signal from the clock supply device 903, superimposes the E-system clock signal on the main signal, and transmits the superimposed signal to the clock supply device 905 of the lower level. The clock supply device 905 receives the clock signal from the clock supply devices 901 and 903 and generates a clock signal in synchronization with the received clock signal.

The clock supply device 905 normally generates a clock signal in synchronization with the N-system clock signal from the clock supply device 901. When an abnormality occurs in the N system, the clock supply device 905 generates a clock signal in synchronization with the E-system clock signal from the clock supply device 903. By switching from the N system to the E system in this manner, stable clock supply can be ensured and the reliability of the clock path network can be improved. The SDH device 906 transmits and receives the main signal based on the clock signal from the clock supply device 905. Similarly, the SDH device 907 transmits and receives the main signal based on the clock signal from the clock supply device 905. Accordingly, the apparatus of the C station can be synchronized with the apparatus of the A station or the B station.

The frequency signal generation system according to the third embodiment is not limited to the clock transmission system. The frequency signal generation system includes a system constituted with various devices and a plurality of devices on which the atomic oscillator is mounted and the frequency signal of the atomic oscillator is used. The frequency signal generation system includes a controller that controls the atomic oscillator.

The frequency signal generation system according to the third embodiment may be, for example, a smartphone, a tablet terminal, a timepiece, a mobile phone, a digital still camera, a liquid ejection device such as an inkjet printer, a personal computer, a television, a video camera, a video tape recorder, a car navigation device, a pager, an electronic notebook, an electronic dictionary, a calculator, an electronic game device, a word processor, a workstation, a video phone, a crime prevention TV monitor, an electronic binoculars, a point of sales (POS) terminal, medical equipment, a fish finder, a global navigation satellite system (GNSS) frequency standard, various measuring instruments, a meter, a flight simulator, a digital terrestrial broadcasting system, a mobile phone base station, or a moving object.

Examples of the medical equipment include an electronic thermometer, a sphygmomanometer, a blood glucose meter, an electrocardiogram measuring device, an ultrasonic diagnostic device, an electronic endoscope, and a magnetocardiograph. Examples of the meter include meters of automobiles, airplanes, and ships. Examples of the moving object include automobiles, airplanes, and ships.

In the present disclosure, a part of the configuration may be omitted within a range having the characteristics and effects described in the application, or each embodiment or modification examples may be combined.

The present disclosure is not limited to the above-described embodiments, and various modifications can be made. For example, the present disclosure includes substantially the same configuration as that described in the embodiments. The substantially same configuration is, for example, a configuration having the same function, method, and result, or a configuration having the same purpose and effect. In addition, the present disclosure includes a configuration in which a non-essential part of the configuration described in the embodiments is replaced. In addition, the present disclosure includes a configuration that exhibits the same operational effects as those of the configuration described in the embodiment or a configuration that can achieve the same purpose. In addition, the present disclosure includes a configuration in which a known technique is added to the configuration described in the embodiments.

What is claimed is:

1. A semiconductor laser comprising:
   a first mirror layer;
   a second mirror layer;
   an active layer disposed between the first mirror layer and the second mirror layer;
   a current confinement layer disposed between the first mirror layer and the second mirror layer;
   a first region provided continuously with the first mirror layer and including a plurality of first oxidized layers; and
   a second region provided continuously with the second mirror layer and including a plurality of second oxidized layers, wherein
   the first mirror layer, the second mirror layer, the active layer, the current confinement layer, the first region, and the second region constitute a laminated body,
   in a plan view, the laminated body includes
      a first part including the first region and the second region,
      a second part including the first region and the second region, and
      a third part disposed between the first part and the second part and resonating light generated in the active layer,
   the third part includes
      a fourth part including the first region and the second region and having a first groove,
      a fifth part including the first region and the second region and having a second groove, and
      a sixth part disposed between the fourth part and the fifth part and sandwiched between the first part and the second part, in a plan view.

2. The semiconductor laser according to claim 1, wherein
   the first groove is provided along an outer edge of the fourth part in a plan view, and
   the second groove is provided along an outer edge of the fifth part in a plan view.

3. The semiconductor laser according to claim 2, wherein
   the first groove includes a third groove and a fourth groove separated from the third groove, and
   the second groove includes a fifth groove and a sixth groove separated from the fifth groove.

4. The semiconductor laser according to claim 2, wherein
   one end and the other end of the first groove are positioned at the sixth part, and
   one end and the other end of the second groove are positioned at the sixth part.

5. The semiconductor laser according to claim 1, wherein
   the first groove and the second groove are not provided at the sixth part.

6. The semiconductor laser according to claim 1, wherein
   a depth of the first groove and a depth of the second groove are equal to or greater than a thickness of the laminated body.

7. The semiconductor laser according to claim 1, further comprising:
   a resin layer disposed at the fourth part and the fifth part.

8. An atomic oscillator comprising:
   a semiconductor laser;
   an atom cell irradiated with light emitted from the semiconductor laser and containing alkali metal atoms; and
   a light receiving element that detects intensity of light transmitted through the atom cell and outputs a detection signal, wherein
   the semiconductor laser includes
      a first mirror layer,
      a second mirror layer,
      an active layer disposed between the first mirror layer and the second mirror layer,
      a current confinement layer disposed between the first mirror layer and the second mirror layer,
      a first region provided continuously with the first mirror layer and including a plurality of first oxidized layers, and
      a second region provided continuously with the second mirror layer and including a plurality of second oxidized layers,
   the first mirror layer, the second mirror layer, the active layer, the current confinement layer, the first region, and the second region constitute a laminated body,
   in a plan view, the laminated body includes
      a first part including the first region and the second region,
      a second part including the first region and the second region, and
      a third part disposed between the first part and the second part and resonating light generated in the active layer,
   the third part includes
      a fourth part including the first region and the second region and having a first groove, a fifth part including the first region and the second region and having a second groove, and a sixth part disposed between the fourth part and the fifth part and sandwiched between the first part and the second part, in a plan view.

\* \* \* \* \*